US010141909B2

(12) United States Patent
Freeman et al.

(10) Patent No.: US 10,141,909 B2
(45) Date of Patent: Nov. 27, 2018

(54) METHOD AND APPARATUS FOR DUAL NOTCH RIPPLE FILTERING

(71) Applicant: General Electric Company, Schenectady, NY (US)

(72) Inventors: Melissa Jean Freeman, Oconomowoc, WI (US); Thomas George McFarland, Hartland, WI (US); Margaret Ann Wiza, New Berlin, WI (US); Douglas Link, Lake Mills, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/723,920

(22) Filed: Oct. 3, 2017

(65) Prior Publication Data

US 2018/0026602 A1    Jan. 25, 2018

Related U.S. Application Data

(62) Division of application No. 14/587,443, filed on Dec. 31, 2014, now Pat. No. 9,893,705.

(51) Int. Cl.
*H03H 7/09* (2006.01)
*H03H 7/06* (2006.01)
*H03H 7/075* (2006.01)
*H03H 7/01* (2006.01)

(52) U.S. Cl.
CPC ............... *H03H 7/09* (2013.01); *H03H 7/06* (2013.01); *H03H 7/075* (2013.01); *H03H 2007/013* (2013.01)

(58) Field of Classification Search
CPC ...... H03H 7/06; H03H 7/09; H03H 2001/075; H03H 2007/013
USPC ........................ 333/172, 175–177; 363/39
See application file for complete search history.

(56) References Cited

U.S. PATENT DOCUMENTS

| | | |
|---|---|---|
| 3,424,983 A | 1/1969 | Schilb |
| 4,809,148 A | 2/1989 | Barn |
| 4,876,739 A | 10/1989 | Ma et al. |
| RE40,907 E | 9/2009 | Steigerwald et al. |
| 7,974,106 B2 | 7/2011 | Gurunathan et al. |
| 8,289,730 B2 | 10/2012 | Gurunathan et al. |
| 8,805,554 B1 | 8/2014 | Latham, II et al. |
| 2004/0051601 A1 | 3/2004 | Frank |
| 2005/0024056 A1 | 2/2005 | Sabate et al. |
| 2008/0224792 A1 | 9/2008 | Nielsen |
| 2010/0156946 A1 | 6/2010 | Kim et al. |
| 2011/0148527 A1 | 6/2011 | Bagga |
| 2012/0250363 A1 | 4/2012 | Skinner |
| 2012/0212304 A1 | 8/2012 | Zhang et al. |
| 2015/0381062 A1 | 12/2015 | Arisawa et al. |

FOREIGN PATENT DOCUMENTS

| | | |
|---|---|---|
| KR | 1020100096276 B1 | 1/2010 |
| WO | 2014066783 A2 | 5/2014 |

*Primary Examiner* — Rakesh Patel

(57) ABSTRACT

An apparatus includes a self-coupled transformer, a first band stop filter and a tank circuit connected in series with the first band stop filter between first and second windings of the self-coupled transformer. An inductor of the tank circuit acts as an out-of-phase third winding of the self-coupled transformer.

9 Claims, 3 Drawing Sheets ously connected in series between the higher and lower potential input terminals, with the second winding connected out-of-phase to the first and third windings; a band stop filter connected in series between the

METHOD AND APPARATUS FOR DUAL NOTCH RIPPLE FILTERING

CROSS-REFERENCE TO RELATED APPLICATIONS

This application is a divisional of U.S. patent application Ser. No. 14/587,443, filed on Dec. 31, 2014, the disclosure of which is incorporated herein by reference in its entirety.

BACKGROUND

Embodiments of the invention relate generally to power electronics. Particular embodiments relate to apparatus and methods for filtering the voltage output from gradient power amplifiers that are used in magnetic resonance imaging (MRI) systems.

Generally, the quality of images produced by an MRI system will be affected by the repeatability and fidelity of its electronic components. In particular, gradient subsystem power amplifiers strongly influence the fidelity with which a scan volume is voxelated (scanned in volume segments of equal size and common orientation). Power amplifier ripple or oscillation can degrade a desired uniformity of voxel size and orientation.

Accordingly, MRI systems are provided with apparatus for correcting images in response to deviations in the performance of electronic components such as the gradient subsystem power amplifiers. One such apparatus is a ripple cancellation filter, which is provided to reduce switching noise produced at the gradient coil caused by pulse width modulating the gradient power supply. Typically, ripple cancellation filters are designed to cancel noise around a single fundamental frequency that is driven by a pulse width modulation (PWM) switching frequency of the MRI system in which the filters are installed. In case an MRI system might be operated at any of plural PWM switching frequencies, then plural ripple cancellation filters are installed.

In view of the above, it is desirable to provide apparatus and methods for efficiently implementing a multi-notch ripple cancellation filter that is usable in MRI systems capable of operating at plural PWM switching frequencies. Such apparatus and methods might also be helpful toward filtering the outputs of PWM power supplies, generally.

BRIEF DESCRIPTION

In view of the above, it is desirable to provide apparatus and methods for efficiently implementing a multi-notch ripple cancellation filter that is usable in MRI systems capable of operating at plural PWM switching frequencies. Such apparatus and methods might also be helpful toward filtering the outputs of PWM power supplies, generally.

Embodiments of the invention provide an apparatus that includes a self-coupled transformer; a band stop filter; and a tank circuit connected in series with the band stop filter between first and second windings of the self-coupled transformer. An inductor of the tank circuit acts as an out-of-phase third winding of the self-coupled transformer. Accordingly, the apparatus may provide a dual notch ripple cancellation filter across the self-coupled transformer.

Other embodiments provide an apparatus that includes a self-coupled transformer having first, second, and third windings that may be operatively connected in series between higher and lower potential input terminals, with the second winding connected out-of-phase to the first and third windings; a band stop filter connected in series between the second and third windings of the self-coupled transformer; a first tuning capacitor connected in parallel across the second winding of the self-coupled transformer; and output terminals operatively connected between the first and second windings and between the second and third windings.

Other embodiments implement a method that includes connecting first, second, and third windings of a self-coupled transformer in series across terminals of a pulse width modulated power supply, with one of the windings out-of-phase to the other windings; connecting a first tuning capacitor across the out-of-phase winding of the self-coupled transformer; connecting a band stop filter in series between the out-of-phase winding of the self-coupled transformer and one of the other windings; and connecting a load across the band stop filter and the first tuning capacitor, so that the band stop filter, the first tuning capacitor, and the out-of-phase winding provide a dual notch ripple cancellation filter between the pulse width modulated power supply and the load.

BRIEF DESCRIPTION OF THE DRAWINGS

The present invention will be better understood from reading the following description of non-limiting embodiments, with reference to the attached drawings, wherein below.

DETAILED DESCRIPTION

Figure 1:
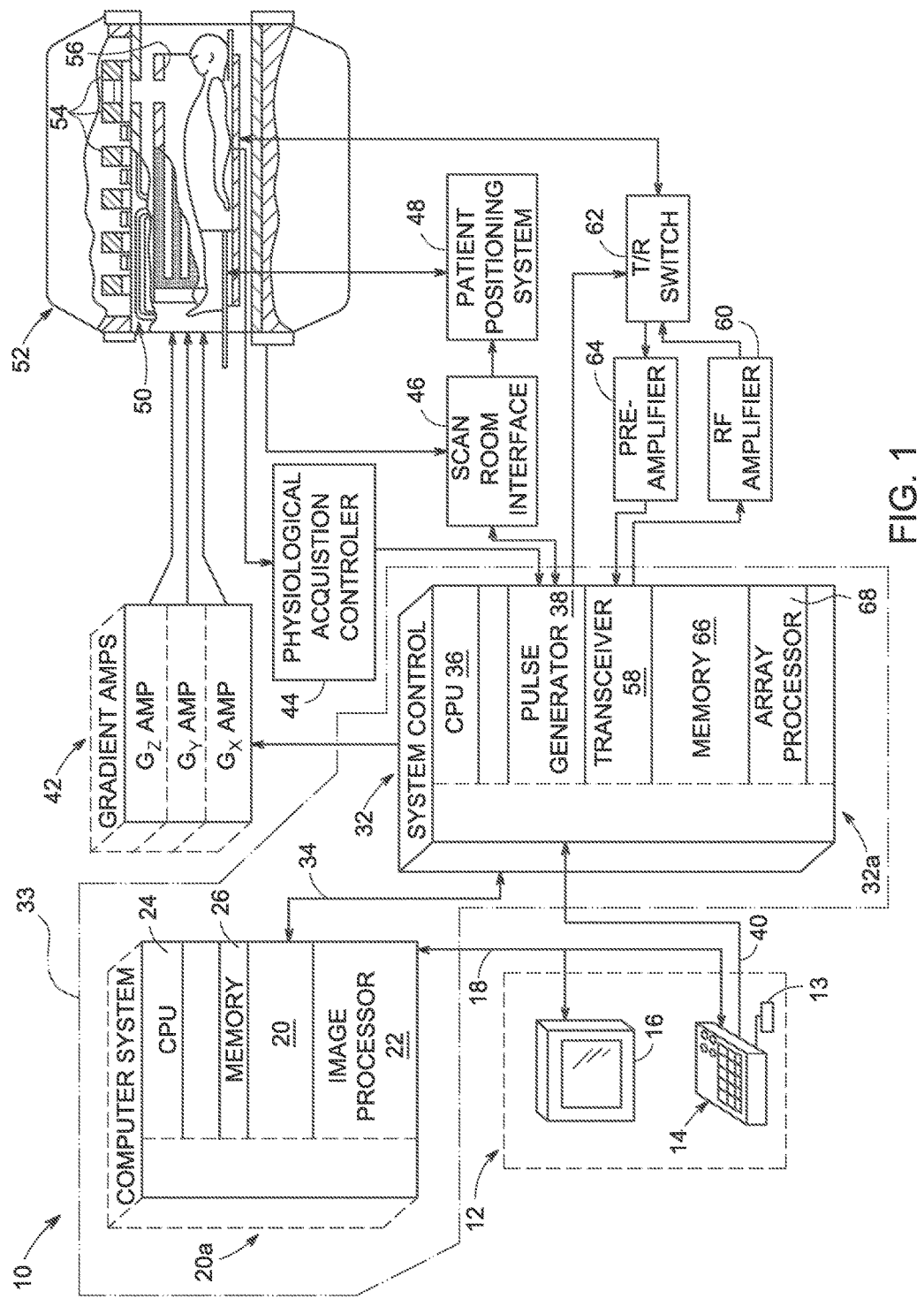
FIG. 1 shows schematically an exemplary magnetic resonance imaging (MRI) system in which an embodiment of the present invention is implemented.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to gradient amplifiers and gradient coils used in MRI systems, embodiments of the invention also are applicable for use with pulse width modulated (PWM) power supplies, generally.

As used herein, the terms "substantially," "generally," and "about" indicate conditions within reasonably achievable manufacturing and assembly tolerances, relative to ideal desired conditions suitable for achieving the functional purpose of a component or assembly.

FIG. 1 shows major components of an exemplary magnetic resonance imaging (MRI) system 10 configured for use with embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33. According to embodiments and aspects of the invention, the MRI controller 33 is configured to accomplish a method for separately imaging water, fat, and silicone, for example by implementing an exemplary algorithm that is further discussed below.

The MRI system control 32 includes a set of modules connected together by a backplane 32a. These include a CPU module 36 as well as a pulse generator module 38. The CPU module 36 connects to the operator console 12 through a serial link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil x, y, or z in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0) and a whole-body RF coil 56 (which, in operation, provides a transverse magnetic field B1 that is generally perpendicular to B0). In an embodiment of the invention, RF coil 56 is a multi-channel coil. A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit mode or receive mode.

After the multi-channel RF coil 56 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long-term storage or it may be further processed by the image processor 22 and conveyed to the operator console 12 and presented on the display 16.

As mentioned above, during operation of the MRI system 10 for an MRI scan, the pulse generator module 38 applies gradient waveforms to the gradient coil assembly 50 via the gradient amplifier system 42. The gradient waveforms drive corresponding gradient coils to locally adjust magnetization of a scan volume enclosed by the magnet assembly 52. In particular, the gradient waveforms provide Frequency Encoding, Phase Encoding, and Slice Selection gradients of magnetization in order to define a specific region of interest for an MRI experiment within the magnet assembly 52.

Figure 2:
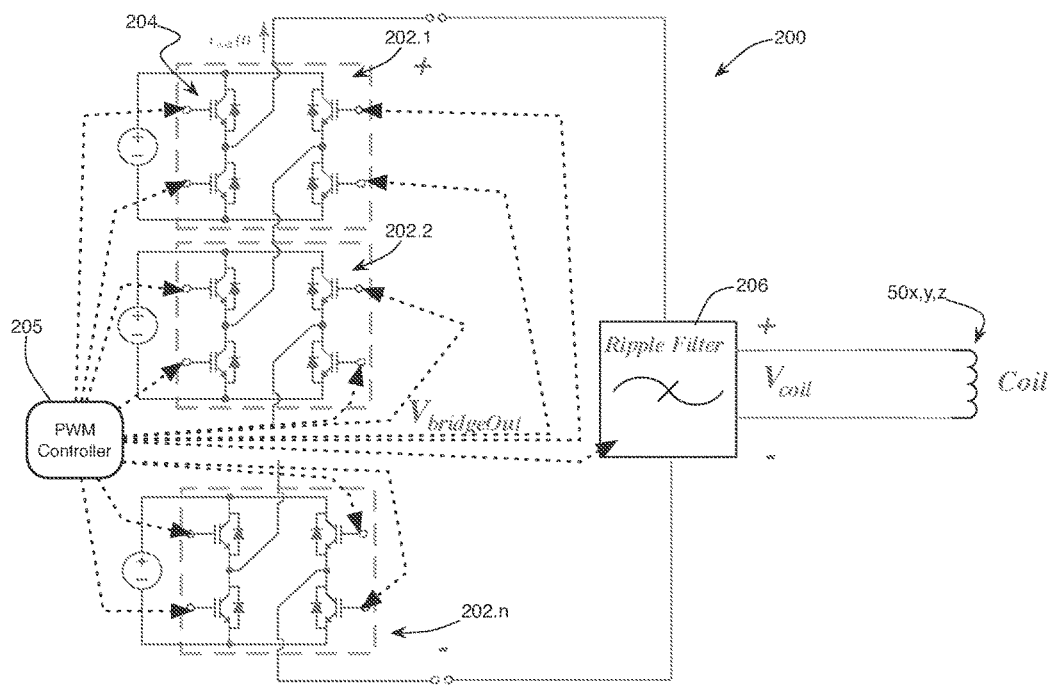
FIG. 2 shows schematically a gradient power amplifier and a ripple cancellation filter used in the exemplary MRI system of FIG. 1.

The gradient amplifier system 42 includes three gradient amplifiers, one per gradient axis (X, Y, Z). FIG. 2 shows schematically a gradient amplifier 200 that is formed as a stacked topology of plural H-bridge circuits 202.1, 202.2, . . . 202.n. The stacked H-bridges 202 are composed of IGBTs 204, which are driven by a PWM controller 205 according to a pulse width modulation algorithm that trades off switching and conductive losses of the IGBTs and bridge interleave schemes. Generally, pulse width modulation (PWM) is a process of turning selected IGBTs on and off, according to a programmed schedule, in order to produce a time-averaged voltage from a DC power supply to a load. The fraction of a PWM schedule for which a device is on is defined as that device's duty cycle. The frequency at which the devices are turning on and off is defined as the PWM switching frequency Fsw of the controller. Although in some schedules (e.g., when PWM is used to simulate AC) the durations of on and off pulse times may vary across a schedule, the switching frequency at which the IGBTs toggle remains constant, i.e., the IGBTs can change state only at an integral multiple of Fsw. The H-bridges 202 are stacked to achieve the required maximum output voltage and in certain embodiments their PWM schedules are interleaved to minimize output filtering requirements.

As mentioned, imaging performance of the MRI system 10 can be influenced by the repeatability and fidelity of the gradient subsystem power amplifiers 200. Therefore, in addition to interleaving PWM schedules, in an embodiment, a ripple cancellation filter 206 is connected across the output terminals of the stacked H-bridges 202 in order to mitigate any influence of the gradient amplifier 200 on imaging performance. The gradient amplifier 200 drives its gradient coil x, y, or z (50 x. y. z.) via the ripple cancellation filter 206. The ripple cancellation filter 206 is configured to monitor output frequency of the pulse width modulation (PWM) controller 205, and to cancel switching noise produced from the stacked H-bridges 202 at harmonics of the PWM frequency.

Figure 3:
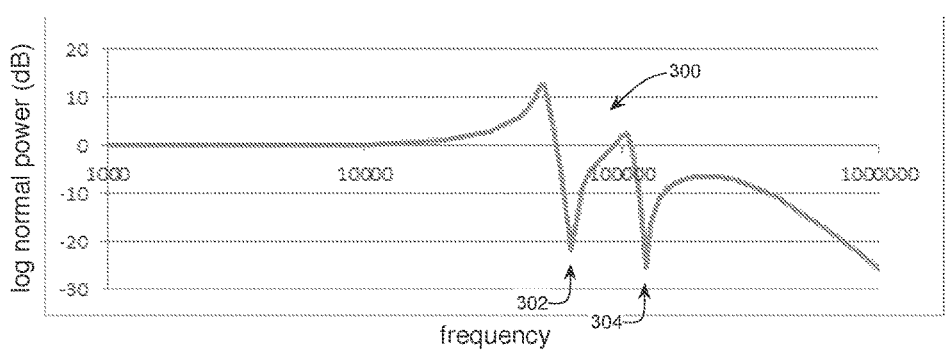
FIG. 3 shows graphically a dual notch frequency rejection image to be provided by a dual notch ripple cancellation filter according to an embodiment of the invention.

FIG. 3 shows graphically a dual notch frequency rejection image 300 to be provided by the ripple cancellation filter 206, according to an embodiment of the invention. In the depicted embodiment, the frequency rejection image 300 includes first and second notches 302, 304 that indicate particularly strong attenuation of signal passing through the filter. The output of the ripple cancellation filter 206 (current supplied to the gradient coil 50) is generally equal to the input to the ripple cancellation filter 206 (bridge current) multiplied by the frequency rejection image 300. By superimposing the notches 302, 304 onto fundamental frequencies of PWM switching noise, the ripple cancellation filter 206 can provide a clean power supply to the gradient coil 50 according to the frequency encoding, phase encoding, and slice selection gradient waveforms as selected by an operation of the MRI control system 32.

Figure 4:
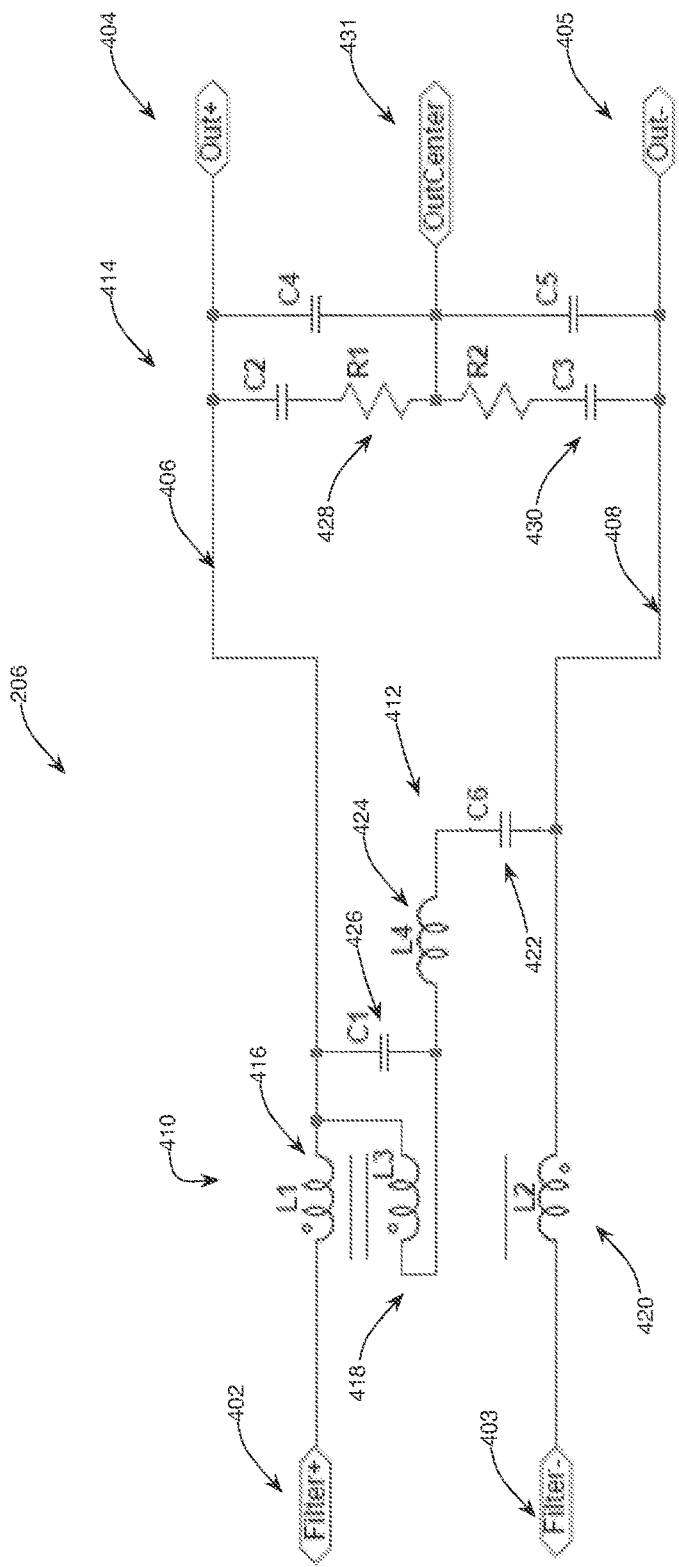
FIG. 4 shows schematically a dual notch ripple cancellation filter according to an embodiment of the invention.

FIG. 4 shows schematically components of the dual notch ripple cancellation filter 206 according to an embodiment of the invention. The ripple cancellation filter 206 includes higher and lower potential input terminals 402, 403 and higher and lower potential output terminals 404, 405 by which the higher and lower potential filter legs 406, 408 can be operatively connected between the gradient power amplifier 200 and the gradient coil 50. The ripple cancellation filter 206 also includes a self-coupled choke transformer 410 and ladder filter 412, which are connected across the filter legs 406, 408 in parallel to a load ladder 414.

In the depicted embodiment, the choke transformer 410 includes a first winding 416, which has its high end connected to the higher potential input terminal 402 and has its low end connected to feed the higher potential filter leg 406. The transformer 410 further includes a second or filter winding 418, which has its low end connected to the higher potential filter leg 406 and has its high end connected to tap the ladder filter 412. The transformer 410 also includes a third winding 420, which has its low end connected to the lower potential input terminal 403 and has its high end connected to the lower potential filter leg 408.

The ladder filter 412 is connected between the higher and lower potential filter legs 406, 408 in parallel to the load ladder 414. The ladder filter 412 includes a first tuning capacitor 422, a tuning inductor 424, and a second tuning capacitor 426. Values of the ladder filter components are selected so that the ladder filter 412 will affect the dual notches 302, 304 of the frequency rejection image 300 as shown in FIG. 3. For example, values of the first tuning capacitor 422 and of the tuning inductor 424 can be selected to define a band stop filter frequency, and values of the filter winding 418 and of the second tuning capacitor 426 can be selected relative to the first and second windings 416, 420, the first tuning capacitor 422, and the tuning inductor 424 to define a band-pass filter frequency that matches and partly cancels the band stop filter frequency, thereby defining the dual notches 302, 304 as side bands of the band-pass filter.

Advantageously, the dual notch ripple cancellation filter 206 can be configured to provide additional notches in the frequency rejection image 300, by adding band-pass and band stop steps onto the ladder filter 412.

One aspect of the invention is that the coupling of the filter winding 418 with the first and third windings 416, 420 alters the frequency response of the tank circuit that would otherwise be formed by the filter winding 418 in parallel with the second tuning capacitor 426.

In embodiments, the load ladder 414 includes resistors 428 and capacitors 430, which are arranged in parallel and have their values selected to allocate voltages among the higher and lower potential output terminals 404, 405 and the center output terminal 431 (which can be ground-connected to balance the gradient coil 50).

Embodiments of the invention provide an apparatus that includes a self-coupled transformer; a first band stop filter; and a tank circuit connected in series with the band stop filter between first and second windings of the self-coupled transformer. An inductor of the tank circuit acts as an out-of-phase third winding of the self-coupled transformer. Accordingly, the apparatus may provide a dual notch ripple cancellation filter across the self-coupled transformer. The apparatus also may include a load ladder of resistors and capacitors connected in parallel across the out-of-phase third winding and the band-stop filter, and the load ladder may be tapped for high, low, and center outputs. The capacitances of the load ladder may be less than the capacitances of the band-stop filter and the tank circuit. The self-coupled transformer windings may have inductances smaller than the inductance of the band-stop filter. The out-of-phase winding of the self-coupled transformer may have an inductance larger than the other windings. The out-of-phase winding of the self-coupled transformer may have an inductance smaller than the other windings. The out-of-phase winding of the self-coupled transformer may have an inductance larger than the inductance of the band-stop filter. The out-of-phase winding of the self-coupled transformer may have an inductance smaller than the inductance of the band-stop filter. The self-coupled transformer windings may have inductances larger than the inductance of the band-stop filter. The apparatus may also include at least one additional band stop filter connected in parallel with the first band stop filter.

Other embodiments provide an apparatus that includes a self-coupled transformer having first, second, and third windings that may be operatively connected in series between higher and lower potential input terminals, with the second winding connected out-of-phase to the first and third windings; a first band stop filter connected in series between the second and third windings of the self-coupled transformer; a first tuning capacitor connected in parallel across the second winding of the self-coupled transformer; and output terminals operatively connected between the first and second windings and between the second and third windings. The apparatus also may include a load ladder of resistors and capacitors connected across the output terminals; wherein the load ladder may be tapped for high, low, and center outputs. The capacitances of the load ladder may be less than the capacitances of the band-stop filter and the first tuning capacitor. The self-coupled transformer windings may have inductances smaller than the inductance of the band-stop filter. The out-of-phase winding of the self-coupled transformer may have an inductance larger than the other windings. The out-of-phase winding of the self-coupled transformer may have an inductance smaller than the other windings. The out-of-phase winding of the self-coupled transformer may have an inductance larger than the inductance of the band-stop filter. The out-of-phase winding of the self-coupled transformer may have an inductance smaller than the inductance of the band-stop filter. The self-coupled transformer windings may have inductances larger than the inductance of the band-stop filter. The apparatus may also include at least one additional band stop filter connected in parallel to the first band stop filter.

Other embodiments implement a method that includes connecting first, second, and third windings of a self-coupled transformer in series across terminals of a pulse width modulated power supply, with one of the windings out-of-phase to the other windings; connecting a first tuning capacitor across the out-of-phase winding of the self-coupled transformer; connecting a first band stop filter in series between the out-of-phase winding of the self-coupled transformer and one of the other windings; and connecting a load across the band stop filter and the first tuning capacitor, so that the band stop filter, the first tuning capacitor, and the out-of-phase winding provide a dual notch ripple cancellation filter between the pulse width modulated power supply and the load. The method also may include connecting at least one additional band stop filter in parallel to the first band stop filter, wherein the at least one additional band stop filter provides at least one additional notch for ripple cancellation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus and methods, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An apparatus comprising:
   a self-coupled transformer having first, second, and third windings that are operatively connected in series between higher and lower potential input terminals, with the second winding connected out-of-phase to the first and third windings;
   a first band stop filter connected in series between the second and third windings of the self-coupled transformer;
   a first tuning capacitor connected in parallel across the second winding of the self-coupled transformer; and
   output terminals operatively connected between the first and second windings and between the second and third windings.

2. The apparatus of claim 1, further comprising at least one additional band stop filter connected in parallel to the first band stop filter.

3. The apparatus of claim 1, further comprising:
   a load ladder of resistors and capacitors connected across the output terminals;
   wherein the load ladder is tapped for high, low, and center outputs.

4. The apparatus of claim 1, wherein the first, second, and third windings have inductances smaller than an inductance of the first band stop filter.

5. The apparatus of claim 1, wherein the second winding of the self-coupled transformer has an inductance larger than the first and third windings.

6. The apparatus of claim 1, wherein the second winding of the self-coupled transformer has an inductance larger than an inductance of the first band stop filter.

7. The apparatus of claim 1, wherein the first, second, and third windings have inductances larger than an inductance of the first band stop filter.

8. A method comprising:
   connecting first, second, and third windings of a self-coupled transformer in series across terminals of a pulse width modulated power supply, with one of the windings out-of-phase to the other windings;
   connecting a first tuning capacitor across the out-of-phase winding of the self-coupled transformer;

connecting a first band stop filter in series between the out-of-phase winding of the self-coupled transformer and one of the other windings; and connecting a load across the first band stop filter and the first tuning capacitor;

wherein the first band stop filter, the first tuning capacitor, and the out-of-phase winding provide a dual notch ripple cancellation filter between the pulse width modulated power supply and the load.

9. The method of claim 8, further comprising connecting at least one additional band stop filter in parallel to the first band stop filter, wherein the at least one additional band stop filter provides at least one additional notch for ripple cancellation.

* * * * *